(12) United States Patent
Saeki

(10) Patent No.: US 6,575,691 B1
(45) Date of Patent: Jun. 10, 2003

(54) TRANSFER ARM

(75) Inventor: Hiroaki Saeki, Shirane-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/744,175

(22) PCT Filed: Jul. 22, 1999

(86) PCT No.: PCT/JP99/03921

§ 371 (c)(1),
(2), (4) Date: Jan. 19, 2001

(87) PCT Pub. No.: WO00/05762

PCT Pub. Date: Feb. 3, 2000

(30) Foreign Application Priority Data

Jul. 22, 1998 (JP) ............................................ 10-223613

(51) Int. Cl.$^7$ ............................................... B66C 23/00
(52) U.S. Cl. ................................. 414/744.5; 414/744.2; 414/744.4; 901/15; 74/490.01
(58) Field of Search ............................ 414/744.2, 744.4, 414/744.5, 744.3; 901/15; 74/490.01

(56) References Cited

U.S. PATENT DOCUMENTS

| | | | |
|---|---|---|---|
| 4,666,366 A | | 5/1987 | Davis |
| 4,712,969 A | * | 12/1987 | Kimura ...................... 148/402 |
| 5,180,276 A | | 1/1993 | Hendrickson |
| 5,227,708 A | | 7/1993 | Lowrance |
| 5,421,695 A | * | 6/1995 | Kimura ................... 414/744.5 |
| 5,725,352 A | * | 3/1998 | Tanaka .................... 414/744.5 |
| 5,743,704 A | | 4/1998 | Caveney et al. |
| 5,971,701 A | * | 10/1999 | Kawamura et al. ......... 414/800 |

FOREIGN PATENT DOCUMENTS

| | | |
|---|---|---|
| JP | 1-252379 | 10/1989 |
| JP | 4-331090 | 11/1992 |
| JP | 5-129418 | 5/1993 |
| JP | 9-254061 | 9/1997 |

OTHER PUBLICATIONS

PCT Notification of Transmittal of Copies of Translation of the International Preliminary Examination Report (PCT/IB/338) corresponding to PCT/JP99/03921.
International Preliminary Examination Report (PCT/IPEA/409) (translated) corresponding to PCT/JP99/03921.
English Abstract corresponding to Japanese Patent Document No. 05129418 A.
English Abstract corresponding to Japanese Patent Document No. 04331090 A.
English Abstract corresponding to Japanese Patent Document No. 09254061 A.
English Abstract corresponding to Japanese Patent Document No. 01252379 A.

* cited by examiner

*Primary Examiner*—Eileen D. Lillis
*Assistant Examiner*—Michael Lowe
(74) *Attorney, Agent, or Firm*—Smith, Gambrell & Russell, LLP (57) ABSTRACT

A conveying arm of the invention includes a first pivotable shaft connected to a first arm which is also pivotably connected to a third arm having an intermediate pivotable portion. The third arm is also pivotably connected to a fifth arm which is also pivotably connected to a seventh arm which has a holding portion for an object to be conveyed. The conveying arm also includes a second pivotable shaft connected to a second arm which is also pivotably connected to a fourth arm having an intermediate pivotable portion. The fourth arm is also pivotably connected to a sixth arm which is also pivotably connected to the seventh arm. With respect to both the third and fourth arms, a line linking one-side end portion to an intermediate pivotable portion is substantially perpendicular to a line linking the other-side end portion to the intermediate pivotable portion.

10 Claims, 12 Drawing Sheets

TRANSFER ARM

FIELD OF THE INVENTION

This invention relates to a conveying arm that can be miniaturized and that is superior in characteristics of control.

BACKGROUND OF THE INVENTION

Conventionally, when a semiconductor substrate such as a semiconductor wafer (that can be abbreviated to "wafer") is conveyed between a cassette that can accommodate the wafer and a semiconductor manufacturing unit or between various semiconductor manufacturing units, a conveying arm that forms a conveying unit is used.

A multi-chamber type of processing unit is explained as an example, which is also a cluster type of unit. In the case, a conveying arm is accommodated in a transfer-chamber (common transfer-chamber). The conveying arm has a substrate holding portion. The substrate holding portion is formed in such a manner that the substrate holding portion can be moved into not only the transfer-chamber but also various process-chambers or a cassette-chamber that are connected to the transfer-chamber. Thus, when the conveying arm is operated, an unprocessed wafer can be conveyed from a cassette in the cassette-chamber to any of the process-chambers through the transfer-chamber. In addition, when the conveying arm is operated, a processed wafer can be conveyed back from any of the process-chambers to the cassette through the transfer-chamber.

As the conveying arm, a scalar-type of conveying arm and a frog-leg type of conveying arm are used in general.

The scalar-type of conveying arm has two or more arms that connect a substrate holding portion and a pivotable shaft. A pivoting mechanism is connected to the pivotable shaft and respective pivotable portions of the arms, for example via one or more rotating belts and one or more pulleys. Thus, when the pivotable shaft is operated, the arms can extend or retract in a horizontal direction and the substrate holding portion can be moved to predetermined positions.

On the other hand, the frog-leg type of conveying arm has a plurality of frog-leg arms, each of which consists of a pair of arms that are connected with each other substantially in a frog-leg manner. The plurality of frog-leg arms connects a substrate holding portion and a pivotable shaft. A pivoting-power transmitting mechanism is connected to the pivotable shaft. When the pivotable shaft is operated, the plurality of frog-leg arms can extend or retract in a radial direction from a center of the pivot and the substrate holding portion can be moved to predetermined positions.

When the scalar type of conveying arm is adopted for the above processing unit, the rotating belts and the pulleys, which form the pivoting mechanism, have to be disposed in the transfer-chamber through which the wafer is moved. Thus, when the conveying arm is operated, particles may tend to be generated. The particles may easily contaminate the wafers and may deteriorate a yield of the wafers.

In addition, in the scalar type of conveying arm, vibrations may tend to be generated because the scalar type of conveying arm has the rotating belts and the pulleys. Thus, it is difficult to raise a conveying speed.

When the frog-leg type of conveying arm is adopted for the above processing unit, the above rotating belts or pulleys generally need not be disposed in the transfer-chamber. Thus, it can be prevented or inhibited that particles are generated and that vibrations are generated. Thus, it is possible to raise a conveying speed.

However, because of the structure itself of the frog-leg type of conveying arm, an end portion of the arms connected to the substrate holding portion can not retract in a radial direction of a side substantially opposite to the substrate holding portion with respect to the center of the pivot of the whole conveying arm. That is, there is a limitation to enlarge an extending/retracting distance, in which the conveying arm can extend and retract, with respect to a pivoting radius of the conveying arm. Thus, when the center of the pivot is away from a position to which a wafer should be moved, the conveying arm has to be proportionally enlarged. Therefore, it is impossible that the unit adopting the conveying arm is miniaturized.

In addition, if the substrate holding portion is arranged further away from the center of the pivot, the substrate holding portion is subjected to a larger centrifugal force when the conveying arm is pivoted. Thus, because of the centrifugal force and/or vibrations caused by the centrifugal force, the wafer placed on the substrate holding portion may be moved out from a predetermined position or may even fall down.

In addition, in both of the scalar type of conveying arm and the frog-leg type of conveying arm, a resolution in a state wherein the conveying arm relatively contracts is very different from a resolution in another state wherein the conveying arm relatively extends. That is, when the conveying arm is caused to extend or contract in the state wherein the conveying arm relatively contracts, a resolution by which the substrate holding portion is moved in a radial direction is relatively high. On the other hand, when the conveying arm is caused to extend or contract in the state wherein the conveying arm relatively extends, a resolution by which the substrate holding portion is moved in the radial direction is relatively low. Thus, it is difficult to exactly convey a wafer placed on the substrate holding portion to a predetermined position. In particular, if the conveying arm is operated at a higher speed, it becomes more difficult to precisely convey the wafer.

SUMMARY OF THE INVENTION

This invention is intended to solve the above problems in the prior art. The object of this invention is to provide a new and improved conveying arm in which an extending/retracting distance with respect to a pivoting radius of the conveying arm is large and a resolution in a state wherein the conveying arm relatively contracts is substantially the same as a resolution in another state wherein the conveying arm relatively extends.

In order to achieve the above object, a conveying arm according to the invention comprises: a first pivotable shaft; a first arm having a one-side end portion connected to the first pivotable shaft; a third arm having an intermediate pivotable portion and a one-side end portion pivotably connected to an other-side end portion of the first arm; a fifth arm having a one-side end portion pivotably connected to an other-side end portion of the third arm; a second pivotable shaft; a second arm having a one-side end portion connected to the second pivotable shaft; a fourth arm having an intermediate pivotable portion pivotably connected to the intermediate pivotable portion of the third arm and a one-side end portion pivotably connected to an other-side end portion of the second arm; a sixth arm having a one-side end portion pivotably connected to an other-side end portion of the fourth arm; and a seventh arm having a holding portion for an object to be conveyed, pivotably connected to an other-end portion of the fifth arm and an other-end portion of the sixth arm; wherein a positional relationship between the one-side end portion of the third arm, the intermediate pivotable portion of the third arm and the other-side end portion of the third arm is in such a manner that a line linking the one-side end portion to the intermediate pivotable portion is substantially perpendicular to a line linking the other-side end portion to the intermediate pivotable portion, and a positional relationship between the one-side end portion of the fourth arm, the intermediate pivotable portion of the fourth arm and the other-side end portion of the fourth arm is in such a manner that a line linking the one-side end portion to the intermediate pivotable portion is substantially perpendicular to a line linking the other-side end portion to the intermediate pivotable portion.

As another feature of the invention, the other-side end portion of the third arm and the other-side end portion of the fourth arm are in a same side as the first pivotable shaft and the second pivotable shaft with respect to the respective intermediate pivotable portions.

Preferably, the third arm and the fourth arm have shapes substantially symmetric with respect to each other. In particular, it is preferable that the third arm and the fourth arm are substantially L-shaped arms.

In addition, it is preferable that the first arm and the second arm have a substantially same length. In addition, it is preferable that the fifth arm and the sixth arm have a substantially same length.

If the first pivotable shaft and the second pivotable shaft are adapted to be independently pivoted around a same axis, a pivoting movement of the holding portion for an object to be conveyed can be achieved by pivoting the first pivotable shaft and the second pivotable shaft in a same direction. In addition, in the case, a linear movement of the holding portion for an object to be conveyed can be achieved by pivoting the first pivotable shaft and the second pivotable shaft in opposite directions.

If the first pivotable shaft and the second pivotable shaft are adapted to be pivoted around separate axes, the first pivotable shaft and the second pivotable shaft are adapted to be pivoted in opposite directions through a same angle. In addition, preferably, the first pivotable shaft and the second pivotable shaft are provided on a driving mechanism that can pivot the whole conveying arm.

In addition, the fifth arm and the sixth arm are adapted to be pivoted with respect to the seventh arm in such a manner that an angle formed by the fifth arm and the seventh arm is always equal to an angle formed by the sixth arm and the seventh arm.

In addition, in order to achieve the above object, another conveying arm according to the invention comprises: a guide extending in a substantially straight manner; a first slider and a second slider that can slide along the guide; a third arm having an intermediate pivotable portion and a one-side end portion pivotably connected to the first slider; a fifth arm having a one-side end portion pivotably connected to an other-side end portion of the third arm; a fourth arm having an intermediate pivotable portion pivotably connected to the intermediate pivotable portion of the third arm and a one-side end portion pivotably connected to the second slider; a sixth arm having a one-side end portion pivotably connected to an other-side end portion of the fourth arm; and a seventh arm having a holding portion for an object to be conveyed, pivotably connected to an other-end portion of the fifth arm and an other-end portion of the sixth arm; wherein a positional relationship between the one-side end portion of the third arm, the intermediate pivotable portion of the third arm and the other-side end portion of the third arm is in such a manner that a line linking the one-side end portion to the intermediate pivotable portion is substantially perpendicular to a line linking the other-side end portion to the intermediate pivot able portion, and a positional relationship between the one-side end portion of the fourth arm, the intermediate pivotable portion of the fourth arm and the other-side end portion of the fourth arm is in such a manner that a line linking the one-side end portion to the intermediate pivotable portion is substantially perpendicular to a line linking the other-side end portion to the intermediate pivotable portion.

In the case, a movement of the holding portion for an object to be conveyed in a direction parallel to the guide can be achieved by moving the first slider and: the second slider in a same direction, and a movement of the holding portion for an object to be conveyed in a direction substantially perpendicular to the guide can be achieved by moving the first slider and the second slider in opposite directions.

In the above intention as well, as another feature, the other-side end portion of the third arm and the other-side end portion of the fourth arm are in a same side as the guide with respect to the respective intermediate pivotable portions.

In the above invention as well, preferably, the third arm and the fourth arm have shapes substantially symmetric with respect to each other. In particular, it is preferable that the third arm and the fourth arm are substantially L-shaped arms. In addition, it is preferable that the first arm and the second arm have a substantially same length. In addition, the fifth arm and the sixth arm are adapted to be pivoted with respect to the seventh arm in such a manner that an angle formed by the fifth arm and the seventh arm is always equal to an angle formed by the sixth arm and the seventh arm.

According to the invention, an end portion of the seventh arm in a side of the fifth arm and the sixth arm can be moved over a center of the pivot of the conveying arm, that is, can retract over the center of the pivot in a direction substantially opposite to an extending direction of the holding portion for an object to be conveyed. Thus, an extending/retracting distance of the conveying arm can be enlarged without increasing a pivoting radius of the conveying arm. Thus, the conveying arm can be miniaturized, and a unit accommodating the conveying arm can be miniaturized.

In addition, when the conveying arm is caused to retract, a center of the holding portion for an object to be conveyed and the center of the pivot of the conveying arm can be substantially equal or close to each other. Thus, even when the conveying arm is pivoted while an object to be conveyed is mounted on the holding portion for an object to be conveyed, the object to be conveyed may not be subjected to a too large centrifugal force. Thus, it can be prevented that the object to be conveyed is moved out from a prescribed position on the holding portion for an object to be conveyed or that the object to be conveyed falls down from the holding portion for an object to be conveyed.

In addition, since the third arm and the fourth arm whose intermediate pivotable portions are connected with each other are adopted, a resolution of the movement (an extending/contracting rate) of the conveying arm in a state wherein the conveying arm relatively contracts may be substantially equal to a resolution of the movement in another state wherein the conveying arm relatively extends. Thus, wherever the holding portion for an object to be conveyed is arranged, it may become easy to exactly convey an object to be conveyed placed on the holding portion for an object to be conveyed to a predetermined position. In addition, even if the conveying arm is operated at a higher speed, operational performance of the conveying arm may not be deteriorated and the conveying arm can be controlled easily and surely.

DESCRIPTION OF THE PREFERRED EMBODIMENT

Embodiments of the invention will now be described in more detail with reference to accompanied drawings. In each of the embodiments, the invention is applied to a conveying arm for a semiconductor substrate.

A conveying arm 100 of a first embodiment is explained with reference to FIGS. 1 to 7. At first, a whole structure of the conveying arm 100 is explained.

Figure 1:
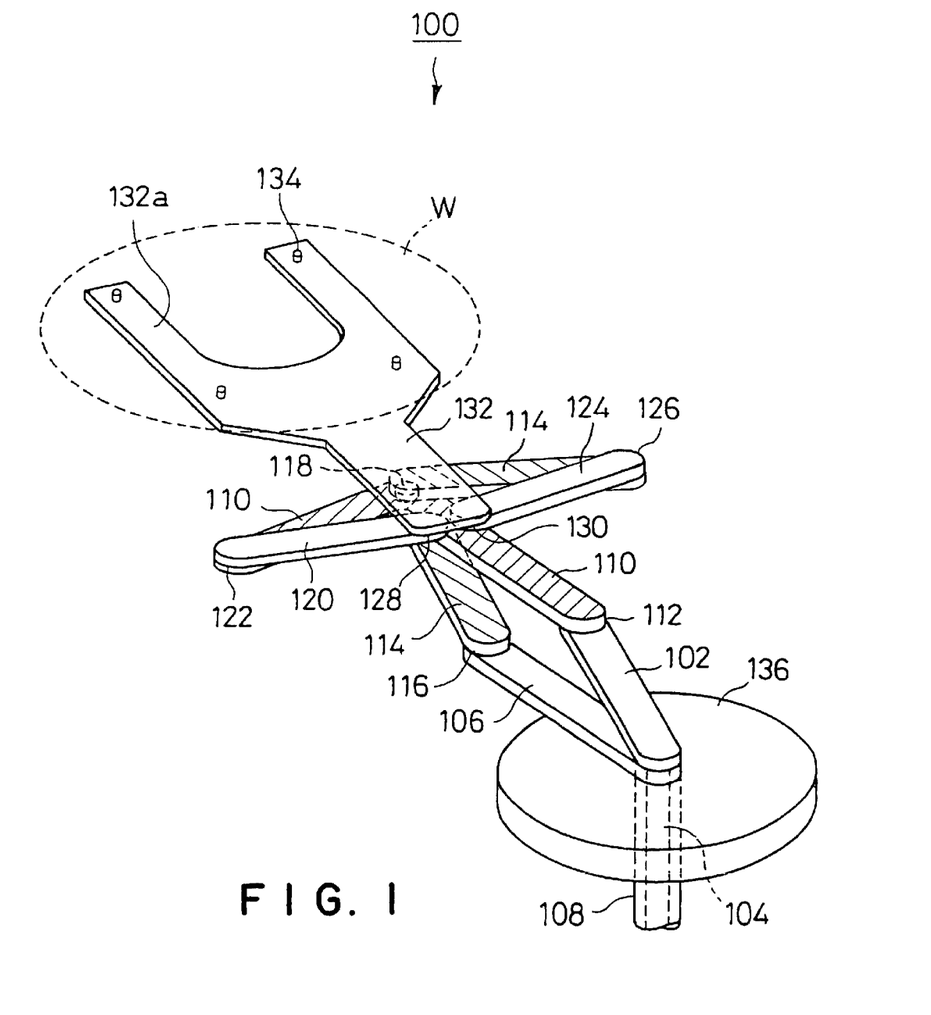
FIG. 1 is a schematic perspective view of a first embodiment of a conveying arm according to the invention.
Figure 2:
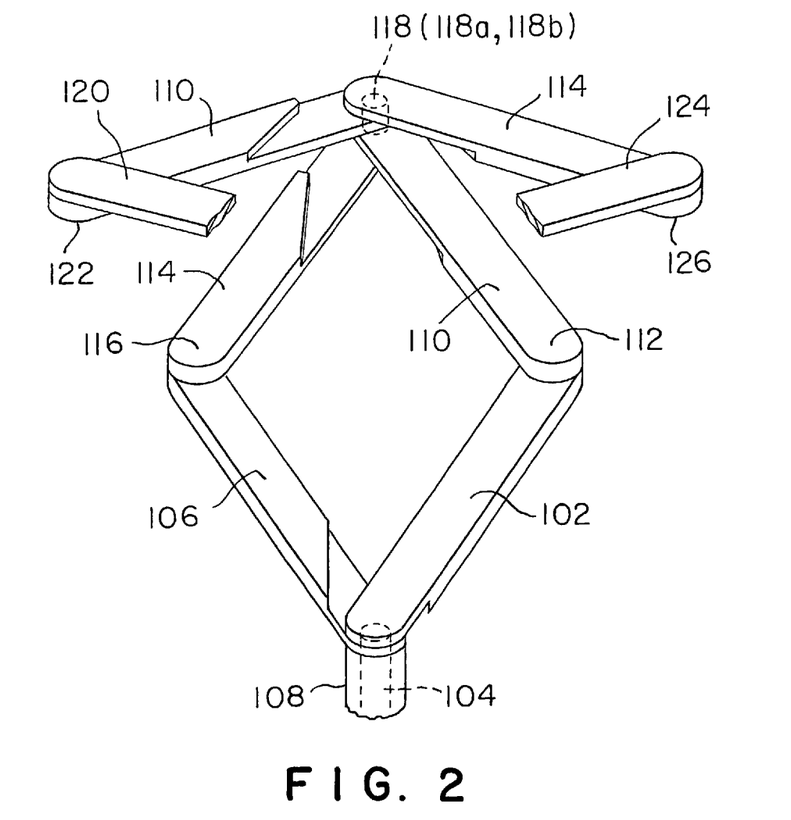
FIG. 2 is a schematic perspective view of a third arm and a fourth arm shown in FIG. 1.
Figure 3:
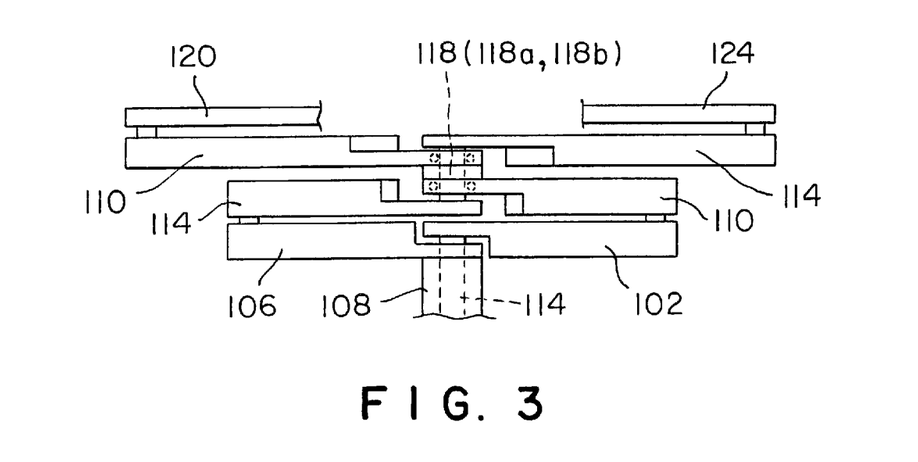
FIG. 3 is a schematic front view of the third arm and the fourth arm shown in FIG. 1.

As shown in FIGS. 1 to 3, a first pivotable shaft 104 is fixed to a one-side end portion of a first arm 102. A second pivotable shaft 108 is fixed to a one-side end of a second arm 106.

Figure 5A:
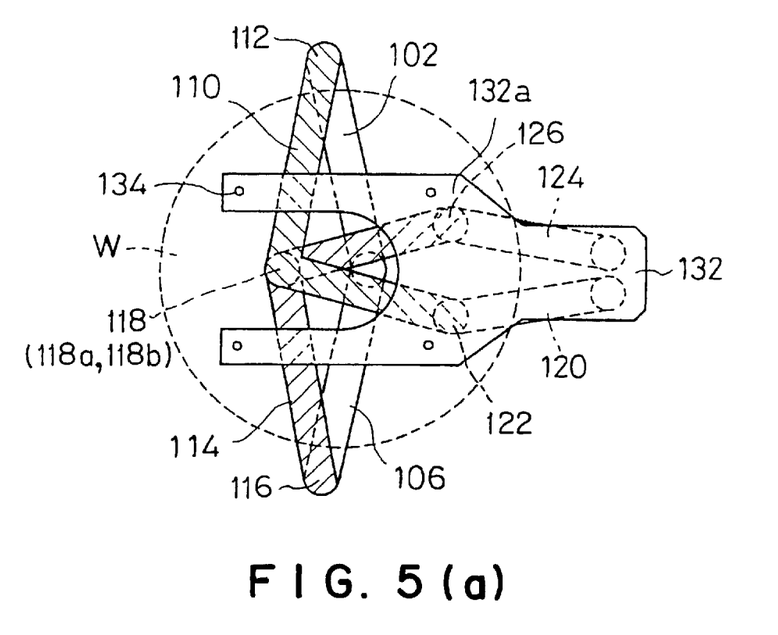
FIGS. 5a and b are a schematic explanatory view for showing an operation of the conveying arm shown in FIG. 1.
Figure 5B:
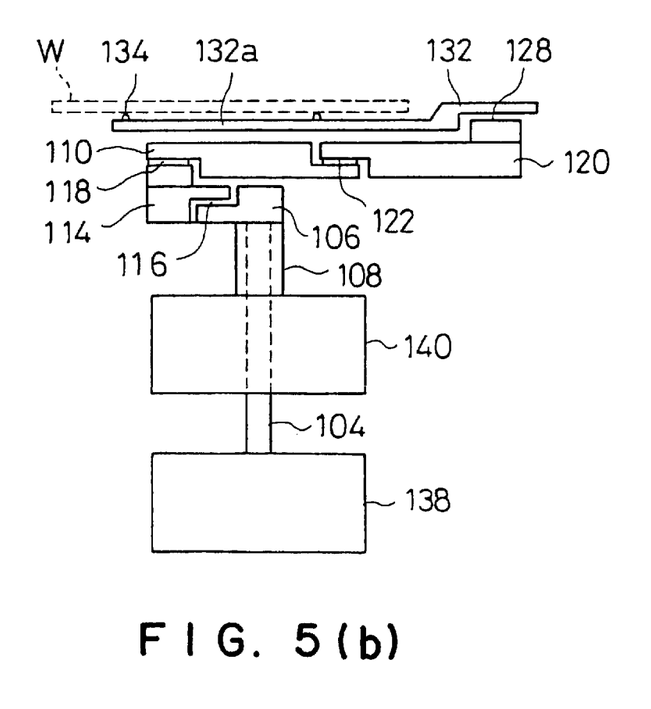

In the case, as shown in FIGS. 1 to 3, the first pivotable shaft 104 and the second pivotable shaft 108 arc formed to have the same axis. That is, the second pivotable shaft 108 is tubular, and the first pivotable shaft 104 is inserted into a hollow portion of the second pivotable shaft 108. A center of a pivot of the first pivotable shaft 104 and a center of a pivot of the second pivotable shaft 108 are arranged in the same axis. In addition, as shown in FIG. 5(b), the first pivotable shaft 104 is connected to a first driving mechanism 138 such as a servomotor, and the second pivotable shaft 108 is connected to a second driving mechanism 140.

In addition, as shown in FIGS. 1 to 3, an other-side end portion of the first arm 102 and a one-side end portion of a third arm 110 are pivotably connected to each other via a first joint 112. The third arm 110 bends at an intermediate pivotable portion 118a thereof and is substantially L-shaped. An other-side end portion of the second arm 106 and a one-side end portion of a fourth arm 114 are pivotably connected to each other via a second joint 116. The fourth arm 114 bends at an intermediate pivotable portion 118b thereof and is substantially L-shaped.

A line linking the one-side end portion of the third arm 110 to the intermediate pivotable portion of the third arm 110 is substantially perpendicular to a line linking the other-side end portion of the third arm 110 to the intermediate pivotable portion of the third arm 110. In addition, a line linking the one-side end portion of the fourth arm 114 to the intermediate pivotable portion of the fourth arm 114 is also substantially perpendicular to a line linking the other-side end portion of the fourth arm 114 to the intermediate pivotable portion of the fourth arm 114.

The intermediate pivotable portion 118a of the third arm 110 and the intermediate pivotable portion 118b of the fourth arm 114 are pivotably connected to each other via a third joint 118. In the case, as shown in FIG. 3, the third joint 118 passes through the third arm 110 and joins two divided portions of fourth arm 114. That is, the third arm 110 and the fourth arm 114 intersect in a vertical plane. Thus, a height of a fifth arm 120 and a height of a sixth arm 124 are adjusted to be the same. In the shown example, a bending angle of the third arm 110 and a bending angle of the fourth arm 114 are 90 degrees, respectively.

The first arm 102 and the second arm 106 have a substantially same length. In addition, the fifth arm 120 and the sixth arm 124 have a substantially same length.

In addition, the other-side end portion of the third arm 110 and a one-side end portion of the fifth arm 120 are pivotably connected to each other via a fourth joint 122. The other-side end portion of the fourth arm 114 and a one-side end portion of the sixth arm 124 are pivotably connected to each other via a fifth joint 126. In addition, the other-side end portion of the fifth arm 120 and the other-side end portion of the sixth arm 124 are pivotably connected to a one-side end portion of a seventh arm 132 via a corresponding sixth joint 128 and a corresponding seventh joint 130, respectively.

Figure 4:
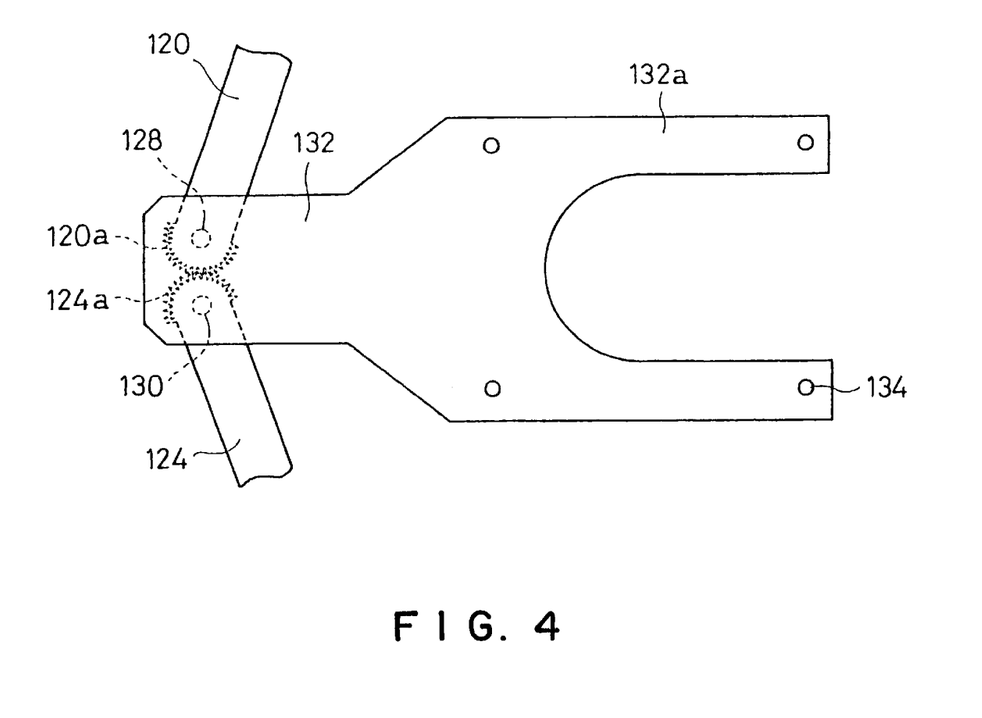
FIG. 4 is a schematic explanatory view for explaining a seventh arm shown in FIG. 1.

As shown in FIG. 4, a gear portion 120a is formed at an end area of the fifth arm 120 on a side of the sixth joint 128. A gear portion 124a is also formed at an end area of the sixth arm 124 on a side of the seventh joint 130. The fifth arm 120 and the sixth arm 124 are attached to the seventh arm 132 in such a manner that the gear portion 120a and the gear portion 124a are engaged with each other. In the case, the seventh arm 132 is arranged to divide an angle formed by the fifth arm 120 and the sixth arm 124 into two substantially equal angles. Even if the gear portion 120a and the gear portion 124a roll and move, a relationship wherein the seventh arm 132 is located to divide the angle formed by the fifth arm 120 and the sixth arm 124 into two substantially equal angles may be maintained. In the example shown in FIG. 1, each of the first to seventh joints 112, 116, 118, 122, 126, 128 and 130 pivotably links the respective arms via a pivotable shaft extending in a vertical direction.

A fork-like substrate holding portion 132a is formed at the seventh arm 132, as a holding portion for an object to be conveyed. In the shown example, the seventh arm 132 and the substrate holding portion 132a are formed in one unity. In addition, holding pins 134 are provided on a placing surface of the substrate holding portion 132a in order to hold a wafer W as an object to be conveyed. The respective arms 102, 106, 110, 114, 120, 124 and 132 are made of aluminum, ceramics or the like.

The first arm 102, the second arm 106, the third arm 110 and the fourth arm 114 are arranged in such a manner that distances between any two of respective pivotable shafts of the first pivotable shaft 104, the first joint 112, the second joint 116 and the third joint 118 are substantially the same. That is, the first arm 102, the second arm 106, a section of the third arm 110 from the one-side end portion to the intermediate pivotable portion 118a and a section of the fourth arm 114 from the one-side end portion to the intermediate pivotable portion 118b are arranged to form a substantially lozenge.

With respect to the fifth arm 120 and the sixth arm 124, the fifth arm 120, the sixth arm 124, a section of the third arm 110 from the intermediate pivotable portion 118a to the other-side end portion and a section of the fourth arm 114 from the intermediate pivotable portion 118b to the other-side end portion are arranged to form a substantially lozenge.

In addition, the conveying arm 110 is mounted on a base 136.

Figure 6A:
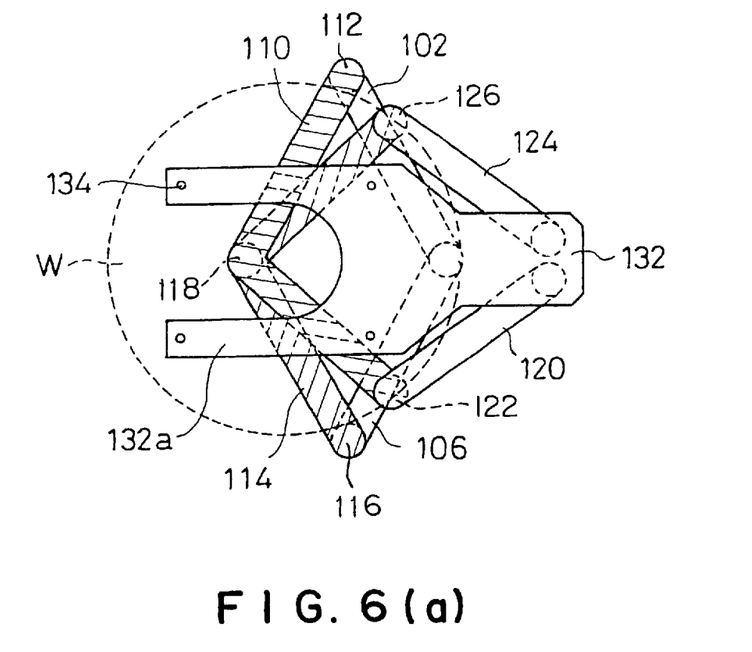
FIGS. 6a and b are another schematic explanatory view for showing the operation of the conveying arm shown in FIG. 1.
Figure 6B:
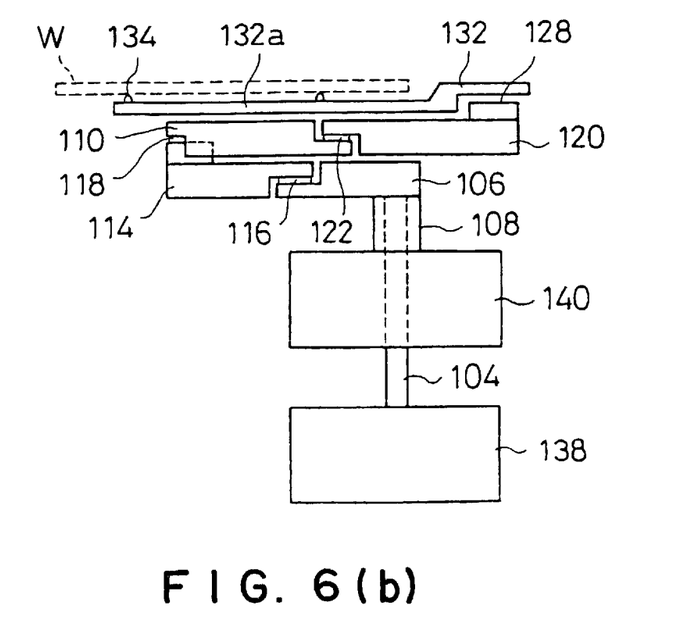
Figure 7A:
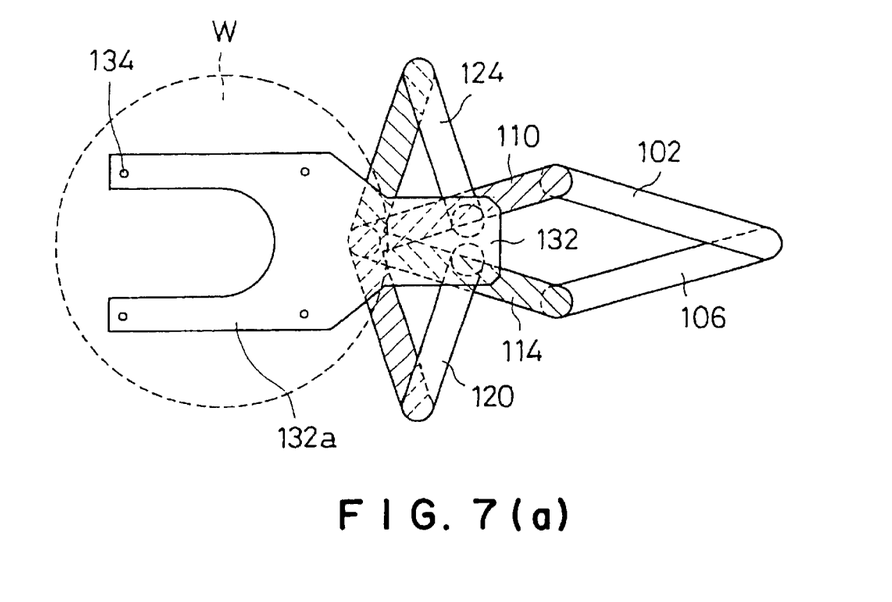
FIGS. 7a and b are another schematic explanatory view for showing the operation of the conveying arm shown in FIG. 1.
Figure 7B:
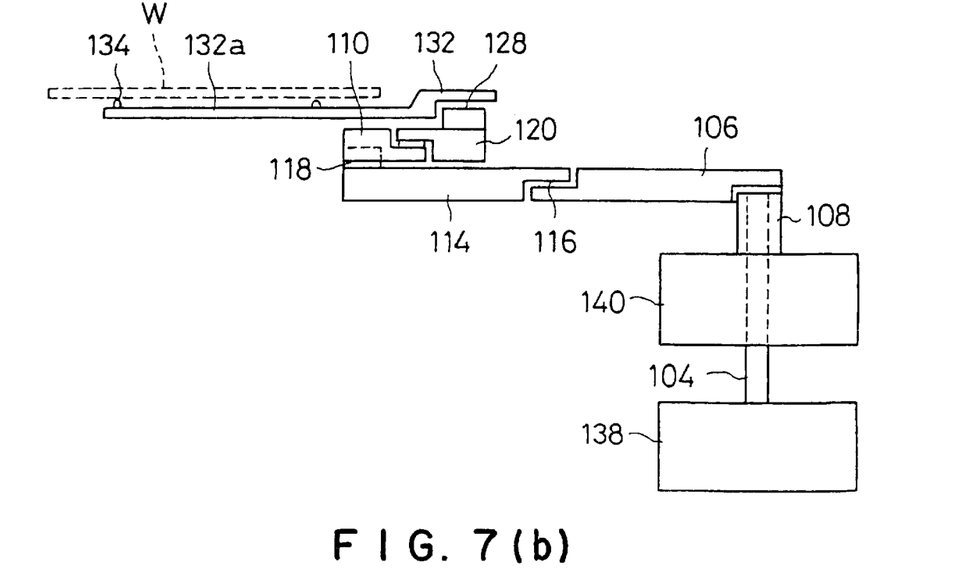

Then, a conveying operation of the conveying arm 100 is explained with reference to FIGS. 5 to 7. FIG. 5 shows a state wherein the conveying arm 100 retracts. FIG. 6 shows a state wherein the conveying arm 100 is on extending. FIG. 7 shows a state wherein the conveying arm 100 extends.

At first, when the conveying arm 100 is caused to extend from the state wherein the conveying arm 100 retracts as shown in FIGS. 5(a) and (b), the first driving mechanism 138 and the second driving mechanism 140 operate to pivot the first pivotable shaft 104 and the second pivotable shaft 108. In the case, the first pivotable shaft 104 is pivoted in a counterclockwise direction, and the second pivotable shaft 108 is pivoted in a clockwise direction. In addition, the first pivotable shaft 104 and the second pivotable shaft 108 are pivoted through the same angle.

According to the above operation, as shown in FIGS. 6(a) and (b), an angle formed by the first arm 102 and the second arm 106 becomes narrow. In addition, an angle formed by the section of the third arm 110 of a side of the first joint 112 with respect to the intermediate pivotable portion 118a and the section of the fourth arm 114 of a side of the second joint 116 with respect to the intermediate pivotable portion 118b also becomes narrow. That is, the third joint 118 (a connecting portion of the third arm 110 and the fourth arm 114) is moved away from the centers of the pivots of the first pivotable shaft 104 and the second pivotable shaft 108.

In addition, an angle formed by the section of the third arm 110 of a side of the fourth joint 122 with respect to the intermediate pivotable portion 118a and the fifth arm 120 also becomes narrow. In addition, an angle formed by the section of the fourth arm 114 of a side of the fifth joint 126 with respect to the intermediate pivotable portion 118b and the sixth arm 124 also becomes narrow. As a result, the substrate holding portion 132a is pushed out in a radius direction from the centers of the pivots.

When the first pivotable shaft 104 and the second pivotable shaft 108 are further pivoted, as shown in FIGS. 7(a) and (b), the angle formed by the first arm 102 and the second arm 106, the angle formed by the section of the third arm 110 of the side of the first joint 112 and the section of the fourth arm 114 of the side of the second joint 116, the angle formed by the section of the third arm 110 of the side of the fourth joint 122 and the fifth arm 120 and the angle formed by the section of the fourth arm 114 of the side of the fifth joint 126 and the sixth arm 124 become narrower respectively. As a result, the substrate holding portion 132a is moved further away from the centers of the pivots.

On the other hand, when the conveying arm 100 is caused to retract from the state wherein the conveying arm 100 extends as shown in FIGS. 7(a) and (b), the first pivotable shaft 104 is pivoted in the clockwise direction, and the second pivotable shaft 108 is pivoted in the counterclockwise direction. In the case as well, the first pivotable shaft 104 and the second pivotable shaft 108 are pivoted through the same angle. According to the above operation, as shown in FIGS. 6(a) and (b), the angle formed by the first arm 102 and the second arm 106, the angle formed by the section of the third arm 110 of the side of the first joint 112 and the section of the fourth arm 114 of the side of the second joint 116, the angle formed by the section of the third arm 110 of the side of the fourth joint 122 and the fifth arm 120 and the angle formed by the section of the fourth arm 114 of the side of the fifth joint 126 and the sixth arm 124 become wider respectively. As a result, the state shown in FIGS. 5(a) and (b) is achieved via the state shown in FIGS. 6(a) and (b). That is, the substrate holding portion 132a is pulled back to the centers of the pivots.

As described above, the first arm 102 and the fifth arm 120 are connected to each other via the substantially L-shaped third arm 110, the second arm 106 and the sixth arm 124 are connected to each other via the substantially L-shaped fourth arm 114 and the intermediate pivotable portion 118a of the third arm 110 and the intermediate pivotable portion 118b of the fourth arm 114 are pivotably connected. Thus, when the conveying arm 100 is caused to retract, as shown in FIGS. 5(a) and (b), the seventh arm 132 can be retract oppositely to the extending direction with respect to the centers of the pivots. Thus, a movable distance of the substrate holding portion 132a can be enlarged with respect to a pivoting radius of the conveying arm 100.

In addition, as described above, the fifth arm 120 and the sixth arm 124 are engaged by the respective gear portions 120a and 124a. Thus, when the conveying arm 100 extends or retracts, the fifth arm 120 and the sixth arm 124 are pivoted in opposite directions through the same angle. Thus, the substrate holding portion 132a can be moved together with the seventh arm 132 in a direction substantially dividing the angle formed by the fifth arm 120 and the sixth arm 124 into two equal angles.

In addition, in order to pivot the conveying arm 100, the first pivotable shaft 104 and the second pivotable shaft 108 are pivoted in the same direction through the same angle, respectively. Thus, the conveying arm 100 can be pivoted in a clockwise direction or in a counterclockwise direction. Thus, the extending/contracting direction of the substrate holding portion 132a can be suitably changed. In addition, while the conveying arm 100 is pivoted, the substrate holding portion 132a may be subjected to only less centrifugal force, by maintaining the state wherein the conveying arm 100 retracts.

In addition, if the first pivotable shaft 104 and the second pivotable shaft 108 are connected to an elevating mechanism not shown, the conveying arm 100 can be vertically moved up and down, that is, a height of the substrate holding portion 132a can be suitably adjusted.

In addition, an extending/contracting distance i.e. a resolution of the movement of the conveying arm 100 in the state wherein the conveying arm contracts may be substantially equal to an extending distance i.e. a resolution of the movement of the conveying arm 100 in the state wherein the conveying arm extends. Thus, a position to which the substrate holding portion 132a is moved can be controlled easily and exactly.

Then, a conveying arm 200 of a second embodiment is explained with reference to FIGS. 8 and 9. In the second embodiment, the same numeral references correspond to the same structures as the above conveying arm 100. The explanation of the same structures is not repeated.

Figure 8:
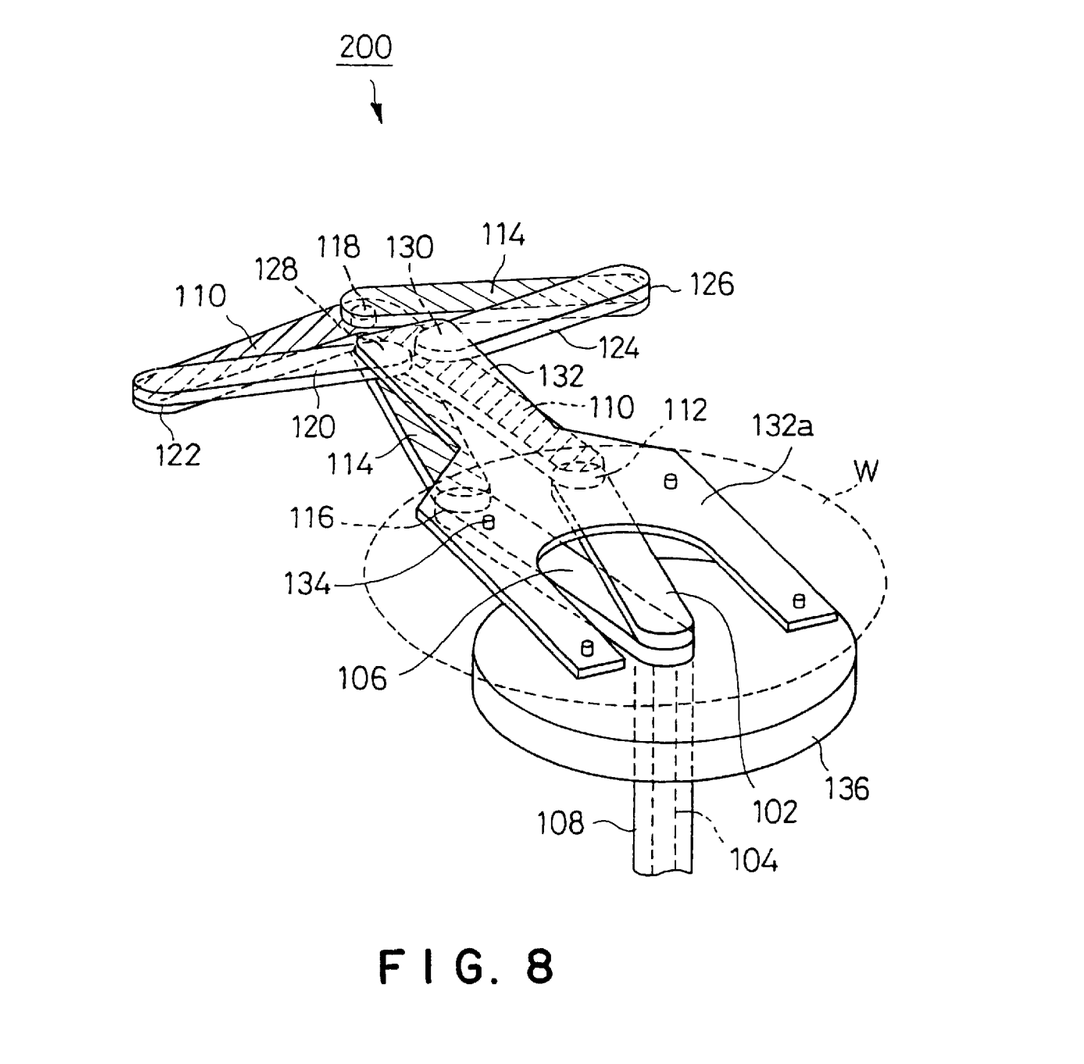
FIG. 8 is a schematic perspective view of a second embodiment of a conveying arm according to the invention.

As shown in FIG. 8, in the conveying arm 200, the seventh arm 132 having the substrate holding portion 132a is attached in a reverse orientation to the case of the above conveying arm 100. In addition, the section of the substantially L-shaped third arm 110 of the side of the fourth joint 122 with respect to the intermediate pivotable portion 118a is longer than that in the conveying arm 100. Similarly, the section of the substantially L-shaped fourth arm 114 of the side of the fifth joint 126 with respect to the intermediate pivotable portion 118b is longer than that in the conveying arm 100. Other structure is substantially the same as the above conveying arm 100.

Figure 9A:
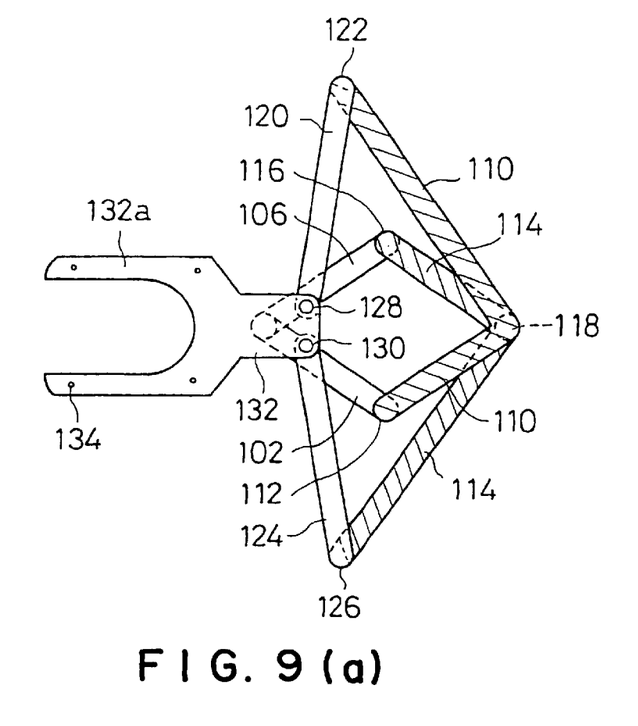
FIGS. 9a and b are a schematic explanatory view for showing an operation of the conveying arm shown in FIG. 8.

According to the above structure, when the conveying arm 200 retracts, as shown in FIG. 9(a), similarly to the above conveying arm 100, the seventh arm 132 can be retract oppositely to the extending direction with respect to the centers of the pivots of the first pivotable shaft 104 and the second pivotable shaft 108.

Figure 9B:
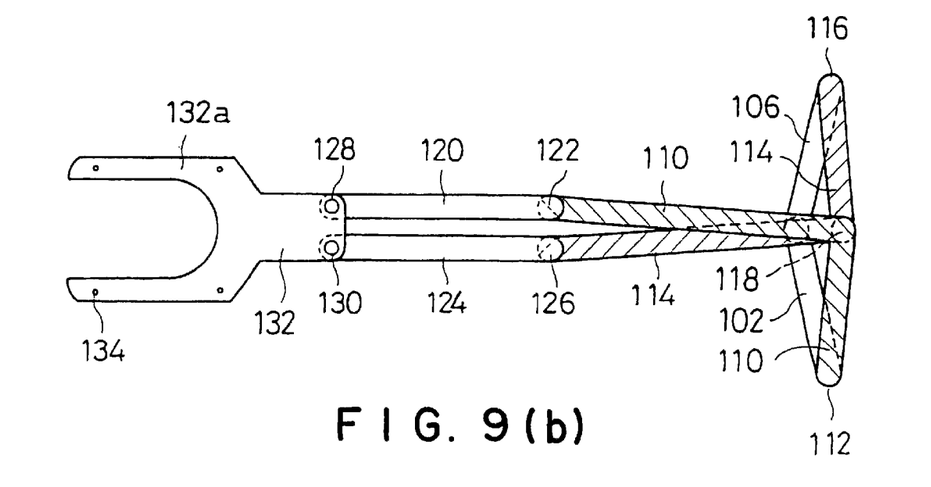

In addition, when the conveying arm 200 extends, as shown in FIG. 9(b), an extending distance can be further enlarged than that in the conveying arm 100.

In the conveying arm 200 of the second embodiment, as described above, the extending distance of the conveying arm 200 can be further enlarged. Thus, the movable distance of the substrate holding portion 132a can be further enlarged with respect to a pivoting radius of the conveying arm 200.

In addition, similarly to the above conveying arm 100, a resolution of the movement of the conveying arm 200 in the state wherein the conveying arm contracts may be substantially equal to a resolution of the movement of the conveying arm 200 in the state wherein the conveying arm extends. Thus, a position to which the substrate holding portion 132a is moved can be controlled easily and exactly.

In addition, in the conveying arm 200 of the second embodiment, pivoting portions tend to interfere with each other less than in the above conveying arm 100. Thus, a linking structure of the arms can be designed more freely.

In the above two embodiments, the first pivotable shaft 104 and the second pivotable shaft 108 are pivoted around the same axis. However, this invention is not limited by the above structures.

Figure 10:
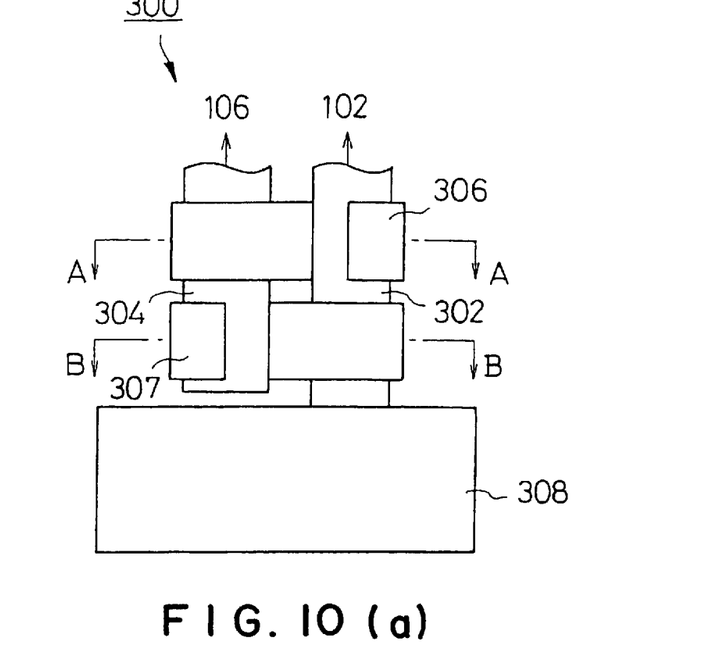
FIGS. 10a–c are a schematic explanatory view for showing another driving mechanism applicable to the conveying arms shown in FIG. 1 and FIG. 8.

For example, FIG. 10(a) shows a first pivotable shaft and a second pivotable shaft in another conveying arm 300. FIG. 10(b) is a schematic sectional view taken along the A—A line of the FIG. 10(a). FIG. 10(c) is a schematic sectional view taken along the B—B line of the FIG. 10(a).

In the conveying arm 300 shown in FIGS. 10(a) to (c), the first pivotable shaft 302 and the second pivotable shaft 304 are arranged in such a manner that a center of a pivot of the first pivotable shaft 302 and a center of a pivot of the second pivotable shaft 304 do not overlap with each other (are not located in the same axis). In addition, the first pivotable shaft 302 and the second pivotable shaft 304 are connected to each other via belts 306 and 307 that are respectively wound in a substantially S-shaped manner or in a substantially reversed S-shaped manner. The first pivotable shaft 302 is connected to the first arm 102 and a driving mechanism 308. The second pivotable shaft 304 is connected to the second arm 106.

According to the above structure, since the first pivotable shaft 302 and the second pivotable shaft 304 are connected to each other via the belts 306 and 307, when the first pivotable shaft 302 is pivoted by the driving mechanism 308, the second pivotable shaft 304 can be pivoted at the same time. In addition, as shown in FIGS. 10(b) and (c), since the belts 306 and 307 are attached in the substantially S-shaped manner or in the substantially reversed S-shaped manner, the first pivotable shaft 302 and the second pivotable shaft 304 can be pivoted in opposite directions through the same angle, respectively.

Figure 11A:
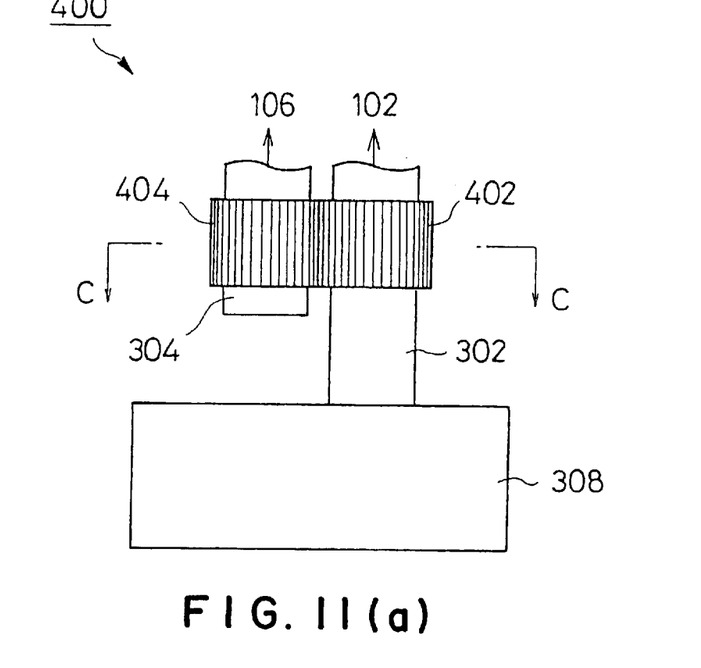
FIGS. 11a–c are a schematic explanatory view for showing another driving mechanism applicable to the conveying arms shown in FIG. 1 and FIG. 8.
Figure 11B:
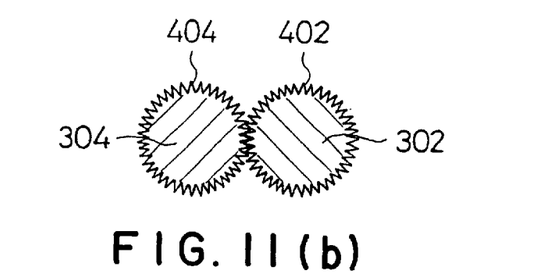

Then, FIG. 11(a) shows a first pivotable shaft and a second pivotable shaft in another conveying arm 400. FIG. 11(b) is a schematic sectional view taken along the C—C line of the FIG. 11(a).

In the conveying arm 400 shown in FIGS. 11(a) and (b), a gear portion 402 and a gear portion 404 are respectively formed at outside peripheries of the first pivotable shaft 302 and the second pivotable shaft 304 that are explained with reference to FIGS. 10(a) to (c). The gear portion 402 and the gear portion 404 are engaged with each other.

Figure 11C:
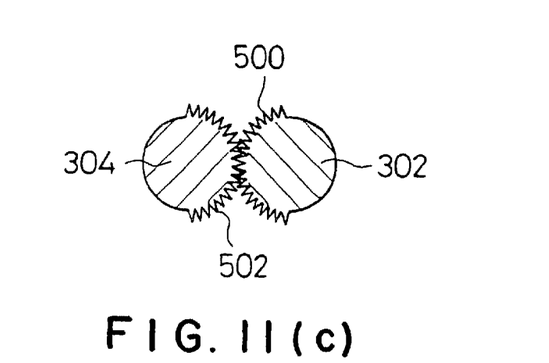

Alternatively, as shown in FIG. 11(c), correspondingly to a pivoting angle of the first pivotable shaft 302 and the second pivotable shaft 304, a gear portion 500 and a gear portion 502 may be respectively formed only at a portion of the outside periphery of the first pivotable shaft 302 and a portion of the outside periphery of the second pivotable shaft 304, the gear portion 500 and the gear portion 502 being engaged with each other. According to the structure, similarly, the first pivotable shaft 302 and the second pivotable shaft 304 can be pivoted through a predetermined angle, respectively.

In each of the above structures, the driving mechanism 308 may be connected to the second pivotable shaft 304, instead of to the first pivotable shaft 302. In addition, each of the gear portions 402, 404, 500 and 502 may be formed separately from the corresponding first pivotable shaft 302 or second pivotable shaft 304.

Figure 12:
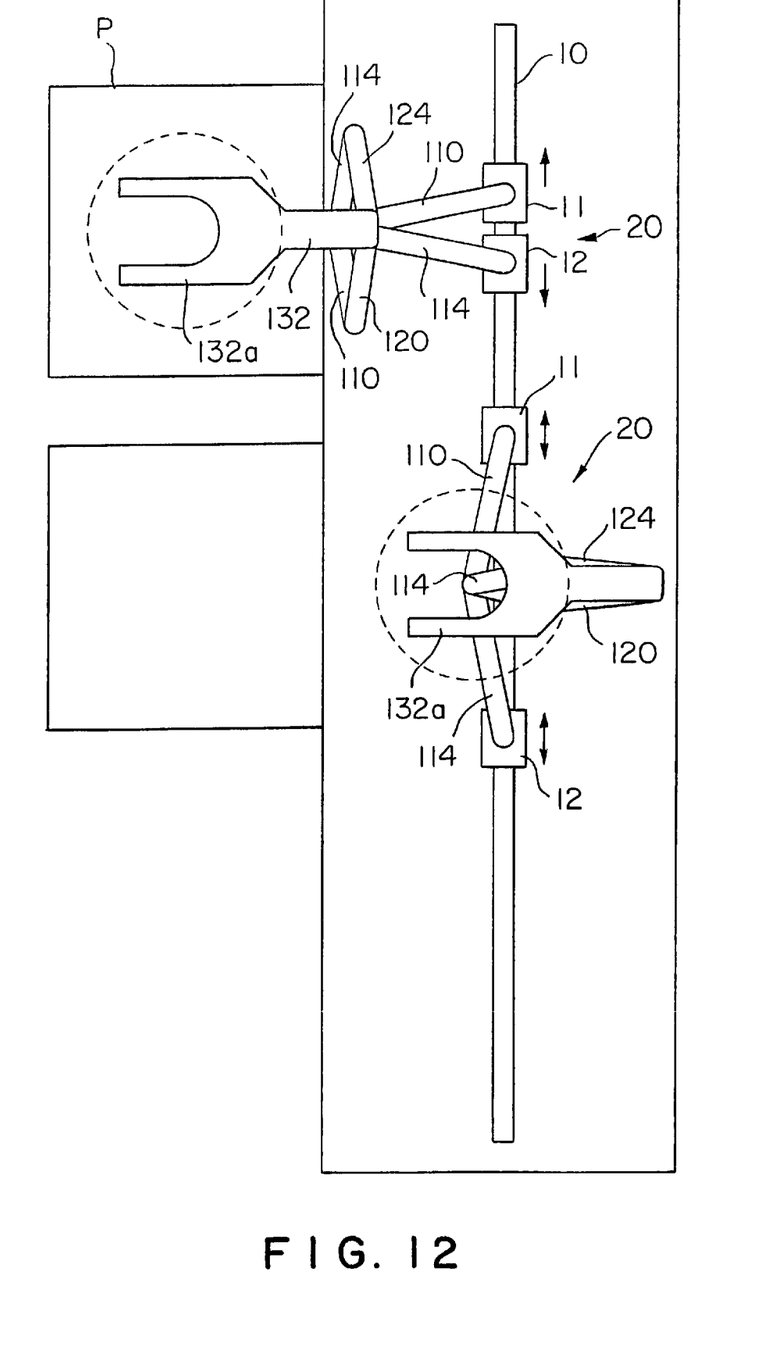
FIG. 12 is a schematic plan view of a third embodiment of a conveying arm according to the invention.

Then, a conveying arm of a third embodiment of the invention is explained with reference to FIG. 12. FIG. 12 is a schematic plan view of the conveying arm of the third embodiment.

As shown in FIG. 12, the conveying arm 20 of the third embodiment includes a guide 10 extending in a substantially straight manner and a first slider 11 and a second slider 12 that can slide along the guide 10, instead of the first pivotable shaft, the second pivotable shaft, the first arm and the second arm. A one-side end portion of the third arm 110 is pivotably connected to the first slider 11. A one-side end portion of the fourth arm 114 is pivotably connected to the second slider 12.

Other structure is substantially the same as the first embodiment shown in FIGS. 1 to 7. In the third embodiment, the same numeral references correspond to the same structures as the first embodiment shown in FIGS. 1 to 7. The explanation of the same structures is not repeated.

FIG. 12 shows two conveying arms 20. A upper conveying arm 20 is in an extending state, and a lower conveying arm 20 is in a contracting state.

In the third embodiment, when the first slider 11 and the second slider 12 are moved in the same direction along the guide 10, a movement of the substrate holding portion 132a in a direction along the guide 10 can be achieved.

In addition, when the first slider and the second slider are moved in opposite directions along the guide 10, a movement of the substrate holding portion 132a in a direction substantially perpendicular to the guide 10 i.e. an extending/contracting movement can be achieved. Thus, a substrate can be conveyed into or from a processing chamber P.

This embodiment can achieve a movement of the substrate holding portion 132a in a direction parallel to the guide 10, instead of the pivoting movement of the substrate holding portion 132a that can be achieved in the above first and second embodiments.

According to the third embodiment, when the conveying arm 20 is caused to contract, the seventh arm 132 can be retract oppositely to the extending direction with respect to the guide 10. Thus, stability when an object to be conveyed is moved along the guide 10 can be very good.

In addition, the substrate holding portion 132a can be moved together with the seventh arm 132 in a direction substantially dividing the angle formed by the fifth arm 120 and the sixth arm 124 into two equal angles.

In addition, an extending/contracting distance of the conveying arm 20 in the state wherein the conveying arm contracts may be substantially equal to an extending/contracting distance of the conveying arm 20 in the state wherein the conveying arm extends. Thus, a position to which the substrate holding portion 132a is moved can be controlled easily and exactly.

Figure 13:
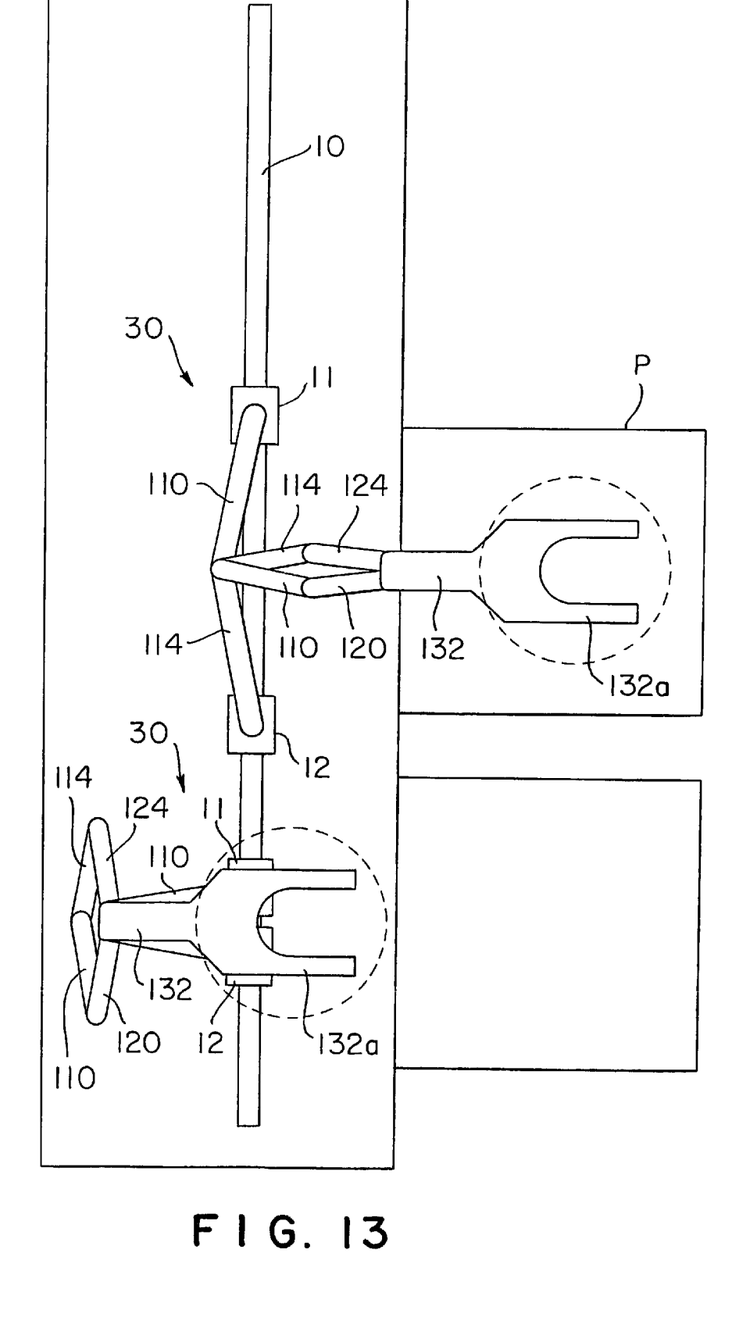
FIG. 13 is a schematic plan view of a fourth embodiment of a conveying arm according to the invention.

Then, a conveying arm of a fourth embodiment of the invention is explained with reference to FIG. 13. FIG. 13 is a schematic plan view of the conveying arm of the fourth embodiment.

As shown in FIG. 13, in the conveying arm 30 of the fourth embodiment, the seventh arm 132 is attached in a reverse orientation to the case of the third embodiment. Other structure is substantially the same as the third embodiment shown in FIG. 12. In the fourth embodiment, the same numeral references correspond to the same structures as the third embodiment shown in FIG. 12. The explanation of the same structures is not repeated.

According to the fourth embodiment, when the conveying arm 30 is caused to contract, the seventh arm 132 can be retract oppositely to the extending direction with respect to the center of the pivot. Thus, stability when an object to be conveyed is moved along the guide 10 can be very good.

In the above embodiments, the seventh arm and the substrate holding portion are formed in one unity. However, the seventh arm and the substrate holding portion are not limited by the manner, but could be formed separately.

A shape of the substrate holding portion 132a is not limited by the fork-like shape, but could be suitably changed correspondingly to an object to be conveyed or a unit for installing the conveying arm.

The preferable embodiments of the invention are explained with reference to the accompanied drawings. However, the invention is not limited by the embodiments, but could be changed or modified by persons skilled in the art in a scope of claims.

What is claimed is:

1. A conveying arm comprising;
a first pivotable shaft;
a first arm having a one-side end portion connected to the first pivotable shaft;
a third arm having an intermediate pivotable portion and a one-side end portion pivotably connected to an other-side end portion of the first arm;
a fifth arm having a one-side end portion pivotably connected to an other-side end portion of the third arm;
a second pivotable shaft;
a second arm having a one-side end portion connected to the second pivotable shaft;
a fourth arm having an intermediate pivotable portion pivotably connected to the intermediate pivotable portion of the third arm and a one-side end portion pivotably connected to an other-side end portion of the second arm;
a sixth arm having a one-side end portion pivotably connected to an other-side end portion of the fourth arm; and
a seventh arm having a holding portion for an object to be conveyed, pivotably connected to an other-end portion of the fifth arm and an other-end portion of the sixth arm;
wherein a positional relationship between the one-side end portion of the third arm, the intermediate pivotable portion of the third arm and the other-side end portion of the third arm is in such a manner that a line linking the one-side end portion to the intermediate pivotable portion is always substantially perpendicular to a line linking the other-side end portion to the intermediate pivotable portion, and
a positional relationship between the one-side end portion of the fourth arm, the intermediate pivotable portion of the fourth arm and the other-side end portion of the fourth arm is in such a manner that a line linking the one-side end portion to the intermediate pivotable portion is always substantially perpendicular to a line linking the other-side end portion to the intermediate pivotable portion.

2. A conveying arm according to claim 1, wherein:
the third arm and the fourth arm have shapes substantially symmetric with respect to each other.

3. A conveying arm according to claim 1, wherein:
the third arm and the fourth arm are substantially L-shaped arms.

4. A conveying arm according to claim 1, wherein:
the first arm and the second arm have a substantially same length.

5. A conveying arm according to claim 1, wherein:
the fifth arm and the sixth arm have a substantially same length.

6. A conveying arm according to claim 1, wherein:
the first pivotable shaft and the second pivotable shaft are adapted to be pivoted around separate axes.

7. A conveying arm according to claim 6, wherein:
the first pivotable shaft and the second pivotable shaft are adapted to be pivoted in opposite directions through a same angle.

8. A conveying arm according to claim 7, wherein:
the first pivotable shaft and the second pivotable shaft are provided on a driving mechanism that can pivot the whole conveying arm.

9. A conveying arm according to claim 1, wherein:
the fifth arm and the sixth arm are adapted to be pivoted with respect to the seventh arm in such a manner that an angle formed by the fifth arm and the seventh arm is always equal to an angle formed by the sixth arm and the seventh arm.

10. A conveying arm, wherein comprising:
a first pivotable shaft;

a first arm having a one-side end portion connected to the first pivotable shaft;

a third arm having an intermediate pivotable portion and a one-side end portion pivotably connected to an other-side end portion of the first arm;

a fifth arm having a one-side end portion pivotably connected to an other-side end portion of the third arm;

a fourth arm having an intermediate pivotable portion pivotably connected to the intermediate pivotable portion of the third arm and a one-side end portion pivotably connected to an other-side end portion of the second arm;

a sixth arm having a one-side end portion pivotably connected to an other-side end portion of the fourth arm; and a seventh arm having a holding portion for an object to be conveyed, pivotably connected to an other-end portion of the fifth arm and an other-end portion of the sixth arm; wherein a positional relationship between the one-side end portion of the third arm, the intermediate pivotable portion of the third arm and the other-side end portion of the third arm is in such a manner that a line linking the one-side end portion to the intermediate intermediate pivotable portion is substantially perpendicular to a line linking the other-side end portion to the intermediate pivotable portion, a positional relationship between the one-side end portion of the fourth arm, the intermediate pivotable portion of the fourth arm and the other-side end portion of the fourth arm is in such a manner that a line linking the one-side end portion to the intermediate pivotable portion is substantially perpendicular to a line linking the other-side end portion to the intermediate pivotable portion, and the other-side end portion of the third arm and the other-side end portion of the fourth arm are in a same side as the first pivotable shaft and the second pivotable shaft with respect to the respective intermediate pivotable portions.

\* \* \* \* \*